United States Patent [19]

Sakemi et al.

[11] Patent Number: 5,428,505
[45] Date of Patent: Jun. 27, 1995

[54] PRINTED CIRCUIT BOARD

[75] Inventors: Shouzi Sakemi; Tadahiko Sakai, both of Fukuoka, Japan

[73] Assignee: Matsushita Electric Industrial Co., Ltd., Osaka, Japan

[21] Appl. No.: 287,584

[22] Filed: Aug. 5, 1994

Related U.S. Application Data

[63] Continuation of Ser. No. 15,009, Feb. 9, 1993, abandoned.

[30] Foreign Application Priority Data

Feb. 24, 1992 [JP] Japan .................................. 4-035935
Jun. 30, 1992 [JP] Japan .................................. 4-172289

[51] Int. Cl.⁶ .............................................. H05K 7/02
[52] U.S. Cl. .................................... 361/777; 361/748; 361/761; 361/765; 361/767; 361/772; 361/783; 361/743; 174/250; 174/260; 174/261; 257/690; 257/692

[58] Field of Search ................ 361/736, 743, 748–749, 361/752, 760–761, 765, 767, 772–774, 777–778, 783, 792, 796; 228/180.1, 180.2; 257/673, 676, 690, 692–694, 696; 174/257, 259, 260–264, 250

[56] References Cited

U.S. PATENT DOCUMENTS 3,033,914 5/1962 Acosta-Lleras ..................... 361/409

FOREIGN PATENT DOCUMENTS 0229741 9/1988 Japan .

*Primary Examiner*—Bot LeDynh
*Attorney, Agent, or Firm*—Lowe, Price, LeBlanc & Becker

[57] ABSTRACT

A printed circuit board comprising a plurality of lands onto which a plurality of leads of an electronic component are soldered. These lands are arrayed in parallel one another. Each of these lands includes a narrow portion basically extending in a longitudinal direction thereof and having a predetermined constant width, and a wide portion protruding laterally from both edges of the narrow portion.

27 Claims, 7 Drawing Sheets

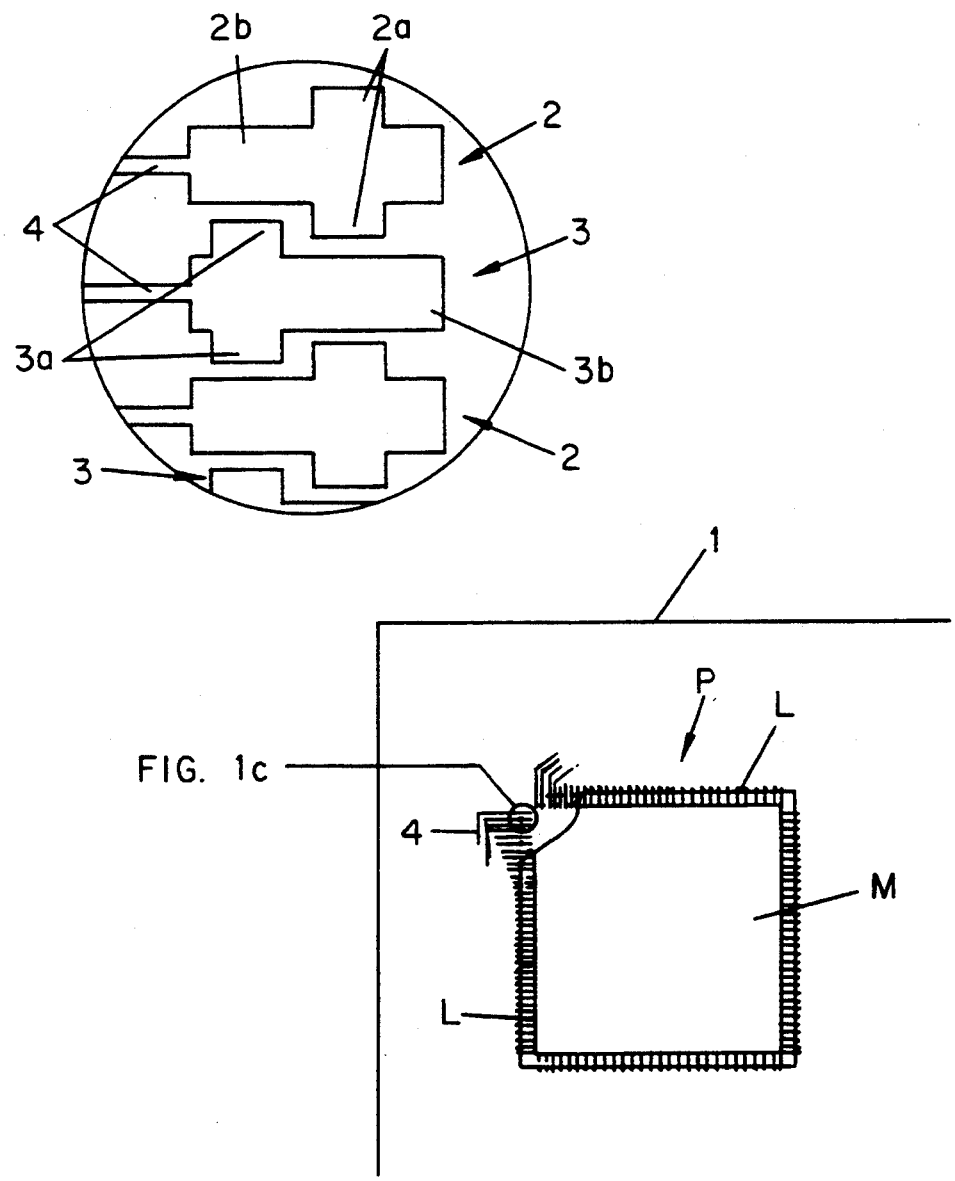

PRINTED CIRCUIT BOARD

This application is a continuation of application Ser. No. 08/015,009 filed Feb. 9, 1993 is now abandoned.

BACKGROUND OF THE INVENTION

1. Field of the Invention

The present invention relates to a printed circuit board, which is usually a flat board whose front contains slots for integrated circuit chips and connections for a variety of electronic components, and whose back is printed with electrically conductive pathways between the components.

2. Description of the Prior Art

Methods for soldering the leads of electronic components on the printed circuit boards are roughly classified into two groups. One is the screen printing method, in which the screen printing machine coats solder cream onto the land of the printed circuit board. The other is the precoat soldering method, in which the solder bump is formed on the land of the printed circuit board by means of an appropriate coating means using, for example, the solder plating.

The screen printing method is cheaper in cost, but is disadvantageous in that the adjustment of coating amount is so difficult that the solder cream cannot be coated uniformly. If too much solder cream is coated, the circuit tends to cause a short circuit because the excessive solder forms a bridge or a ball on the printed circuit board. On the contrary, if too little solder cream is coated, the lead cannot be surely secured onto the land.

Furthermore, the lead is becoming smaller and narrower as the technology advances. Accordingly, the size of the land on the printed circuit board is correspondingly becoming smaller and narrower. In view of such recent advancement of the technology, the screen printing method may not be a prospective soldering method when applied to the printed circuit board due to above-described disadvantages.

On the other hand, in the case of the precoat soldering method, the adjustment of the solder amount to be coated on the land can be easily and accurately done. Thus, the precoat soldering method is recently used for forming the solder bump on the land.

The rigidity of the lead is lowered as its size becomes smaller. Therefore, a smaller and narrower lead is likely to bend back. If the electronic component has a plurality of such smaller and narrower leads, some leads may deform upward. It will directly affect the installation of electronic component on the printed circuit board. Because, these leads may not be able to land on the solder bump of the land, when the electronic component is connected to the printed circuit board. In such a case, the electronic component will not be completely soldered onto the printed circuit board and may produce a defective, even if only one of plural leads deforms.

Moreover, the recent size reduction of the land apparently brings the height reduction of the solder bump on the land. It will increase the percentage of production defects.

SUMMARY OF THE INVENTION

Accordingly, the present invention has a purpose, in view of above-described problems or disadvantages, to provide a printed circuit board which is capable of securely soldering a plurality of smaller and narrower leads of the electronic components thereon.

In order to accomplish the above purpose, a first aspect of the present invention provides a novel printed circuit board comprising a plurality of lands onto which a plurality of leads of an electronic component are soldered. These lands are arrayed in parallel one another. Each of these lands include a narrow portion basically extending in a longitudinal direction thereof and having a predetermined constant width, and a wide portion protruding laterally from both edges of the narrow portion.

Furthermore, in accordance with a second aspect of the present invention, wide portions of adjacent two lands are offset each other in the longitudinal direction of the lands.

Moreover, in accordance with a third aspect of the present invention, each land includes a pair of narrow portions having the predetermined constant width and a wide portion sandwiched between these narrow portions and having another width wider than the predetermined constant width.

Still further, in accordance with a fourth aspect of the present invention, the wide portion includes a round protrusion such as a semicircle.

Yet further, in accordance with a fifth aspect of the present invention, each land includes a first rectangular portion having the predetermined constant width, a second rectangular portion being spaced from the first rectangular portion and having another width wider than the predetermined constant width, and a third rectangular portion being spaced from the second rectangular portion and having the predetermined constant width.

The above and other objects, features and advantages of the present invention will become more apparent from the following detailed description which is to be read conjunction with the accompanying drawings.

BRIEF DESCRIPTION OF THE DRAWING

FIG. 1b is a plane view showing the printed circuit board in accordance with the first embodiment, whose lands are partly enlarged;

DETAILED DESCRIPTION OF THE PREFERRED EMBODIMENTS

Hereinafter, with reference to accompanying drawings, preferred embodiments of the present invention are explained in detail.

FIRST EMBODIMENT

Figure 1A:
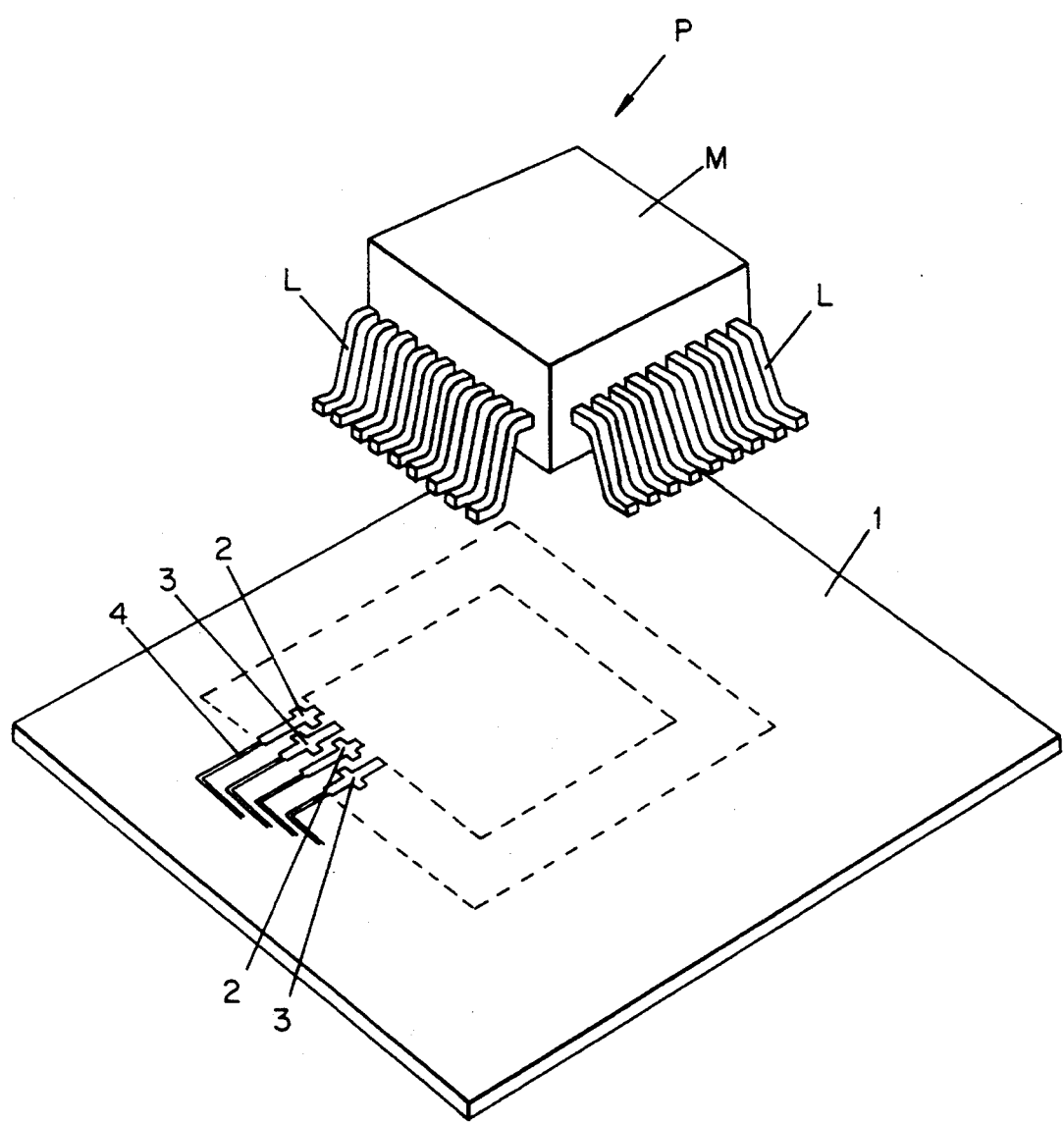
FIG. 1a is a perspective view showing an electronic component having a plurality of leads provided at side walls thereof, and a printed circuit board in accordance with the first embodiment of the present invention which installs the electronic component thereon.

In FIGS. 1a and 1b, an electronic component P has a body M whose configuration looks like a box. The body M has side walls, on which a plurality of leads L are provided so as to be arrayed in a row. Each lead L extends laterally from the side wall of the body M, and bends downward so as to extend obliquely. Thereafter, the lead L bends oppositely to extend laterally again. These leads L are installed on a printed circuit board 1. Both the leads L and the printed circuit board 1 are made of electrically conductive materials.

The printed circuit of the printed circuit board 1 includes lands 2 and 3, onto which the leads L of the electronic component P are placed and soldered. A reference numeral 4 denotes a pathway of the printed circuit other than the lands 2, 3. As will be appreciated from the illustration of FIG. 1a, the width of the pathway 4 may be smaller than the width of each portion of the lands 2, 3.

Figure 2:
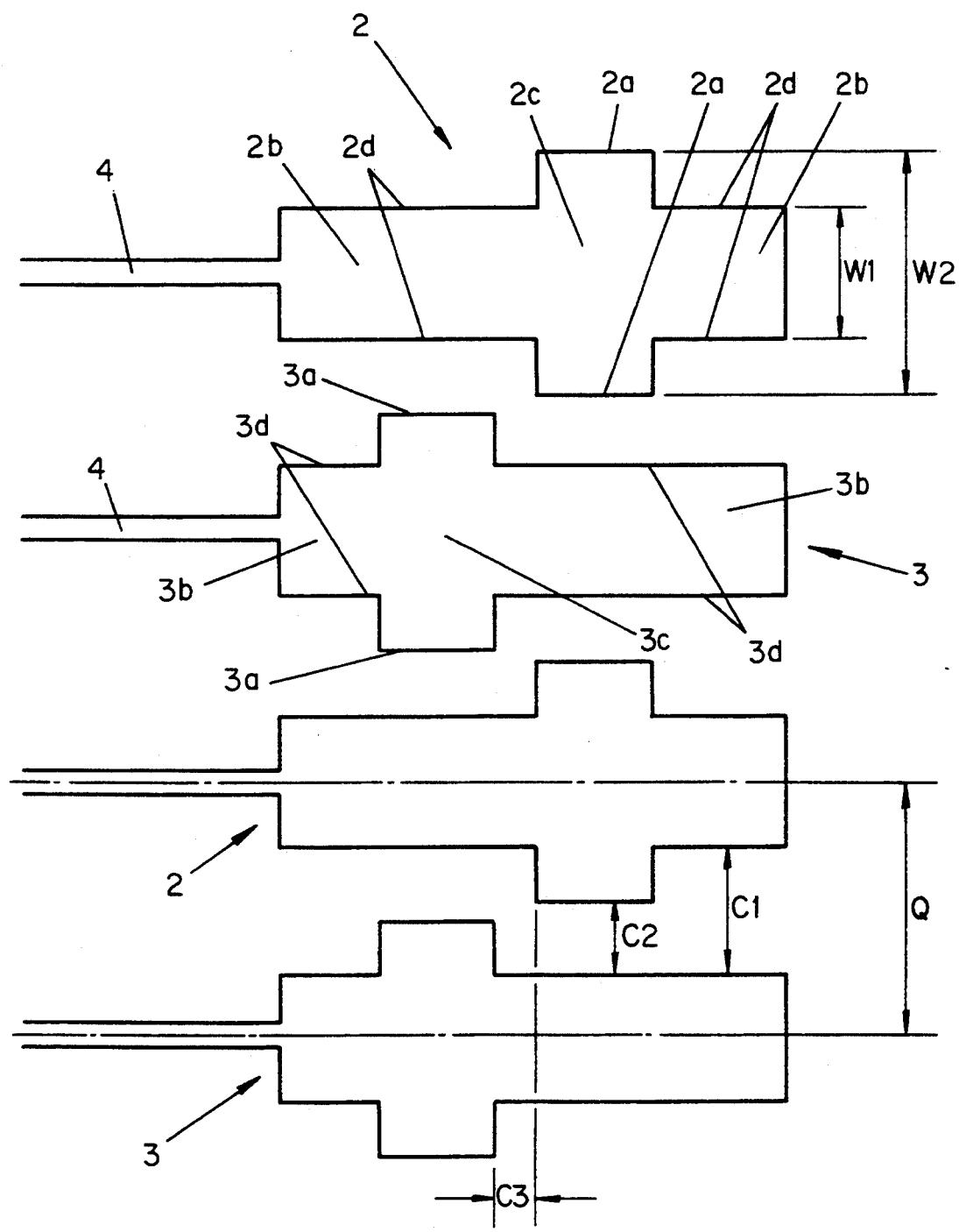
FIG. 2 is an enlarged plane view showing tile lands of FIG. 1b more precisely.

FIG. 2 shows the printed circuit in more detail. The configuration of lands 2, 3 looks like a cross. That is to say, each of lands 2, 3 consists of two rectangular zones which cross with each other at right angle. One rectangular zone has a width of W1 and extends in a longitudinal direction of the land. Namely, the land (2, 3) includes a narrow portion basically extending in the longitudinal direction thereof and having a predetermined constant width W1. The other rectangular zone crosses the former rectangular zone perpendicularly to extend beyond the both edges thereof. The length from one extended edge to the other extended edge of the latter rectangular zone is W2, which is greater than W1. As will be appreciated from the illustration of FIG 2, the width of the latter rectangular zone may be substantially identical to the width W1 of the former rectangular zone. Therefore, the former rectangular zone looks as if its width is enlarged from W1 to W2 at the intermediate portion thereof. Hereinafter, the region having a width W1 is referred to as a narrow portion, while the region having a width W2 is referred to as a wide portion.

Namely, the land 2 has two narrow portions 2b, 2b which extend basically in the longitudinal direction but are divided into two by a wide portion 2c extending basically in the lateral direction. In other words, the wide portion 2c is sandwiched between two narrow portions 2b, 2b. The wide region 2c includes protruding portions 2a, 2a, which extend laterally from both edges 2d, 2d of the land 2. These narrow portions 2b, 2b and wide portion 2c are symmetric about the longitudinal axis of the land 2.

In the same way, the land 3 has two narrow portions 3b, 3b which extend basically in the longitudinal direction but are divided into two by a wide portion 3c extending basically in the lateral direction. In other words, the wide portion 3c is sandwiched between two narrow portions 3b, 3b. The wide region 3c includes protruding portions 3a, 3a, which extend laterally from both edges 3d, 3d of the land 3. These narrow portions 3b, 3b and wide portion 3c are symmetric about the longitudinal axis of the land 3.

The lands 2 and 3 are disposed in parallel with each other so that their longitudinal axes become parallel. Only one difference between the lands 2 and 3 is the layout of the wide portions 2c, 3c. That is to say, the wide portion 2c of the land 2 is offset from the wide portion 3c of the land 3 in the longitudinal direction, so as not to interfere with each other.

In more detail, the lands 2 and 3 are spaced with each other so as to maintain a clearance Q between their longitudinal axes. A clearance between adjacent edges of the lands 2, 3 is C1 in the region where the narrow portions 2b and 3b confront with each other. This clearance reduces from C1 to C2 in the region where the wide portion 2c confronts with the narrow portion 3b or in the region where the wide portion 3c confronts with the narrow portion 2b. The offset amount between the wide portions 2c, 3c is set to maintain a clearance C3 between adjacent edges of the protruding portions 2a, 3a in the longitudinal direction.

The purpose of offsetting the wide portions 2c, 3c is to maintain a sufficient clearance between these two lands 2, 3. For example, if the clearance C1 is equal to the difference W2−W1, the wide portions 2c, 3c cannot maintain a gap therebetween in the case where they are not offset with each other in the longitudinal direction.

However, in the case where they are offset as shown in the drawing, there is provided the clearance C2 and C3 in the region where lands 2, 3 confront closely.

In other words, the clearance Q between the longitudinal axes of the lands 2, 3 can be shortened compared with the case where no offset is employed between lands 2, 3. Therefore, offsetting confronting wide portions of adjacent two lands can contribute the size reduction of the printed circuit board.

Next, a soldering operation of the leads L of the electronic component P onto the lands 2, 3 of the printed circuit board 1 is explained.

Figure 3:
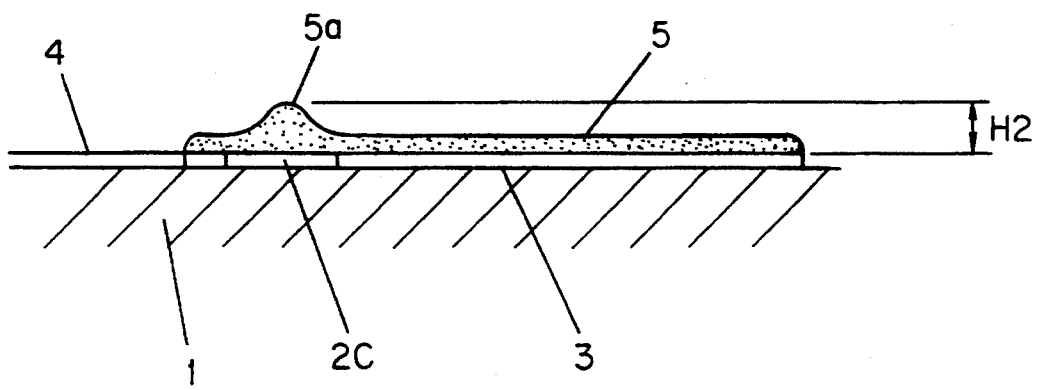
FIG. 3 is an enlarged side view showing the land on which the solder bump is formed.

First of all, solder is coated uniformly on the lands 2, 3 by means of the solder plating. After the thermal treatment, the solder bump 5 is formed on the lands 2, 3, as shown in FIG. 3.

The solder bump 5 has a swelling portion 5a just at the region of the wide portion 2c (3c). The reason why this swelling portion 5a is made is as follows.

First of all, the solder precipitates on the upper surface of the lands 2, 3. Next, this solder is heated in the thermal treatment until the solder melts. And then, the melted solder gathers at the wide portions 2c, 3c due to surface tension and finally forms the swelling portion 5a.

In this manner, by providing the wide portion (2c, 3c) at the intermediate portion of the narrow zone elongated in the longitudinal direction, the melted solder can be gathered locally at this wide portion. Thus, the solder bump 5 having a maximum height H2 at the swelling portion 5a can be obtained.

By the way, it is needless to say that the solder bump 5 can be formed by coating the solder cream on the lands 2, 3 by means of the screen printing machine and then employing the thermal treatment, instead of the usage of the solder plating.

Figure 4C:
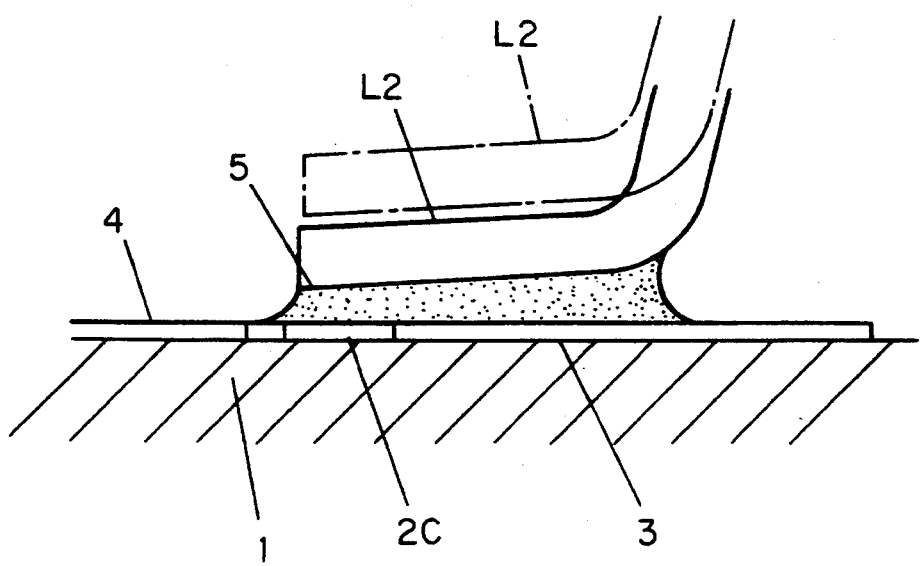
FIG. 4c is also an enlarged side view showing the lead(s) being placed on the land(s) after the solder bumps have been melted in the same way as FIG. 4b but seen from another direction.
Figure 4A:
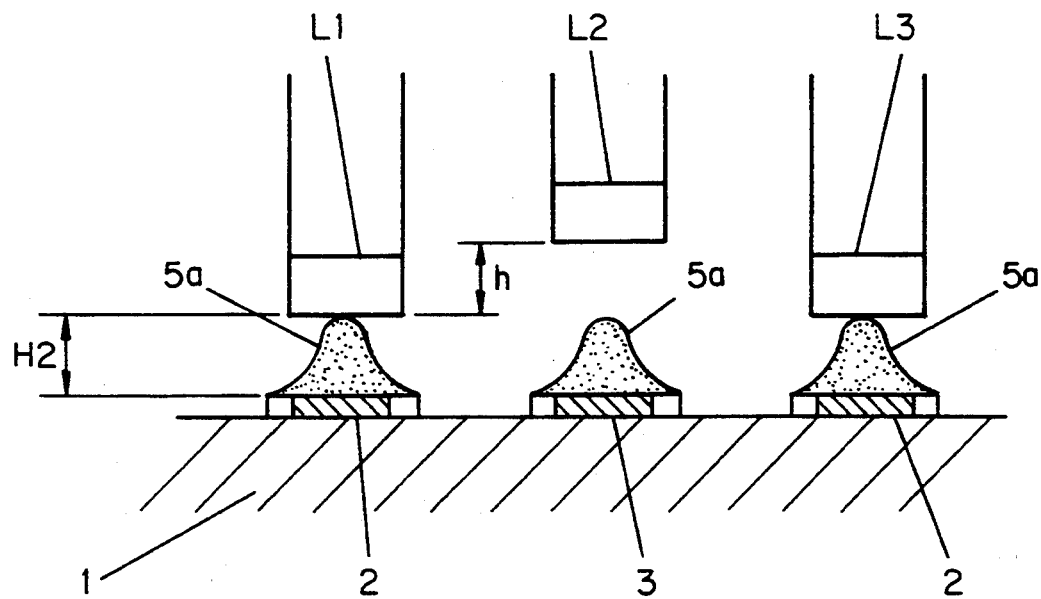
FIG. 4a is an enlarged side view showing the plurality of leads being placed on the solder bumps of the lands, before the solder bumps are melted.

Thereafter, the lead L of the electronic component P is landed or placed on the solder bump 5. (The solder bump 5 is already cooled down to be rigid at this moment) FIG. 4a shows the condition where a plurality of leads L1, L2, and L3 are placed on the solder bumps 5 (strictly speaking, on the swelling portions 5a). Two leads L1 and L3 contact with the swelling portions 5a as shown in the drawing, while the lead L2 is spaced from the corresponding swelling portion 5a because it is deformed upward.

Figure 4B:
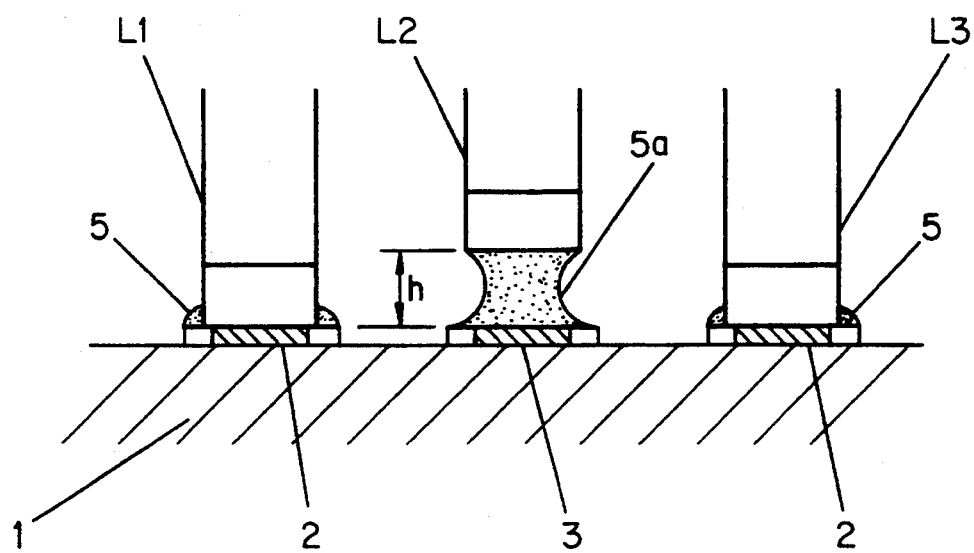
FIG. 4b is an enlarged side view showing the plurality of leads being placed on the lands, after the solder bumps have been melted.

Subsequently, the solder bumps 5 are heated until they melt. As the solder bumps 5 melt, the leads L1, L2, and L3 mash the solder bumps 5 and sink by an amount equivalent to the height H2 of the swelling portion 5a due to the weight of the electronic component P. (See FIG. 4b)

In the case where the lead L2 is accidentally bent upward to have a height clearance h compared with other leads L1 and L3, the lead L2 will be still spaced from the land 3 by the clearance h when the leads L1 and L3 just reach the lands 2. If this clearance h is smaller than the height H2 of the swelling portion 5a, the lead L2 can contact with the melted solder at least at the swelling portion 5a and surely soldered on the land 3. (See FIGS. 4b, 4c)

In other words, the possibility of the deformed lead L2 being soldered on the land L3 increases with the height of the swelling portion 5a. As mentioned above, the height of the swelling portion 5a is increased by providing the wide portions 2c, 3c on the lands 2, 3. Accordingly the present invention is advantageous in ensuring the deformed leads to be soldered on the lands, thus improving the installation of the electronic component on the printed circuit board.

SECOND EMBODIMENT

Next, with reference to FIG. 5, the second embodiment of the printed circuit board in accordance with the present invention will be explained.

Figure 5:
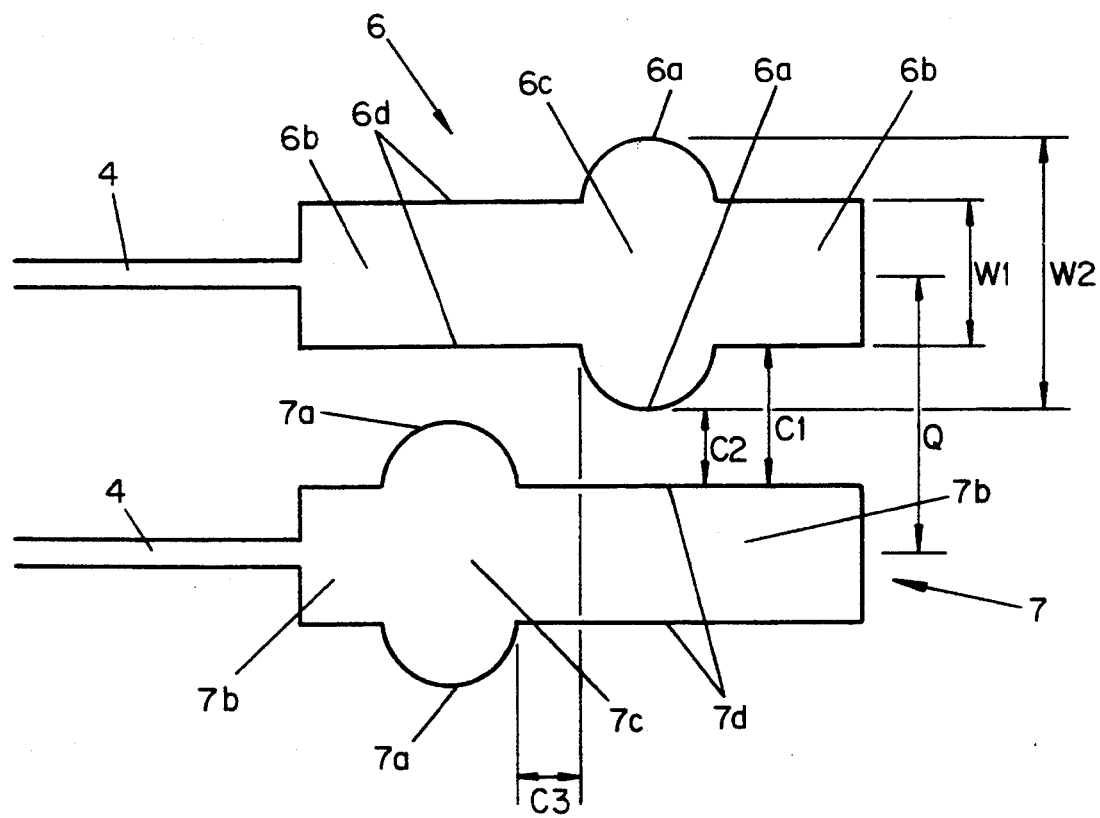
FIG. 5 is a plane view showing an essential part of the second embodiment of the printed circuit board in accordance with the/present invention; and, FIG. 6 is a plane view showing an essential part of the third embodiment of the printed circuit board in accordance with the present invention.

In FIG. 5, the configuration of each of lands 6, 7 also looks like a cross, but a little bit round shape. That is, each of lands 6, 7 consists of one rectangular zone and one elongated circular zone which cross with each other at right angle. The rectangular zone has a width of W1 and extends in a longitudinal direction of the land. Namely, the land (6, 7) includes a narrow portion basically extending in the longitudinal direction thereof and having a predetermined constant width W1. The elongated circular zone crosses this rectangular zone perpendicularly to extend beyond the both edges thereof. The length from one extended edge to the other extended edge of the elongated circular zone is W2, which is greater than W1. The rectangular zone looks as if its width is enlarged from W1 to W2 by adding semicircles at both sided of the intermediate portion thereof. Hereinafter, the region having a width W1 is referred to as a narrow portion, while the region having a width more than W1 is referred to as a wide portion.

Namely, the land 6 has two narrow portions 6b, 6b which extend basically in the longitudinal direction but are divided into two by a wide portion 6c extending basically in the lateral direction. In other words, the wide portion 6c is sandwiched between two narrow portions 6b, 6b. The wide region 6c includes protruding portions 6a, 6a of semicircular shape, which extend laterally from both edges 6d, 6d of the land 6. These narrow portions 6b, 6b and wide portion 6c are symmetric about the longitudinal axis of the land 6.

In the same way, the land 7 has two narrow portions 7b, 7b which extend basically in the longitudinal direction but are divided into two by a wide portion 7c extending basically in the lateral direction. In other words, the wide portion 7c is sandwiched between two narrow portions 7b, 7b. The wide region 7c includes protruding portions 7a, 7a of semicircular shape, which extend laterally from both edges 7d, 7d of the land 7. These narrow portions 7b, 7b and wide portion 7c are symmetric about the longitudinal axis of the land 7.

The lands 6 and 7 are disposed in parallel with each other so that their longitudinal axes become parallel. Only one difference between the lands 6 and 7 is the layout of the wide portions 6c, 7c. That is to say, the wide portion 6c of the land 6 is offset from the wide portion 7c of the land 7 in the longitudinal direction, so as not to interfere with each other.

In more detail, the lands 6 and 7 are spaced one another so as to maintain a clearance Q between their longitudinal axes. A clearance between adjacent edges of the lands 6, 7 is C1 in the region where the narrow portions 6b and 7b confront with each other. This clearance reduces from C1 to C2 in the region where the wide portion 6c confronts most closely with the narrow portion 7b or in the region where the wide portion 7c confronts most closely with the narrow portion 6b. The offset amount between the wide portions 6c, 7c is set to maintain a clearance C3 between adjacent edges of the protruding portions 6a, 7a in the longitudinal direction.

The purpose of offsetting the wide portions 6c, 7c is the same as the first embodiment. Also, the soldering operation of the leads of the electronic component P onto the lands 6, 7 is carried out in the same fashion as the first embodiment.

THIRD EMBODIMENT

Next, with reference to FIG. 6, the third embodiment of the printed circuit board in accordance with the present invention will be explained.

Figure 6:
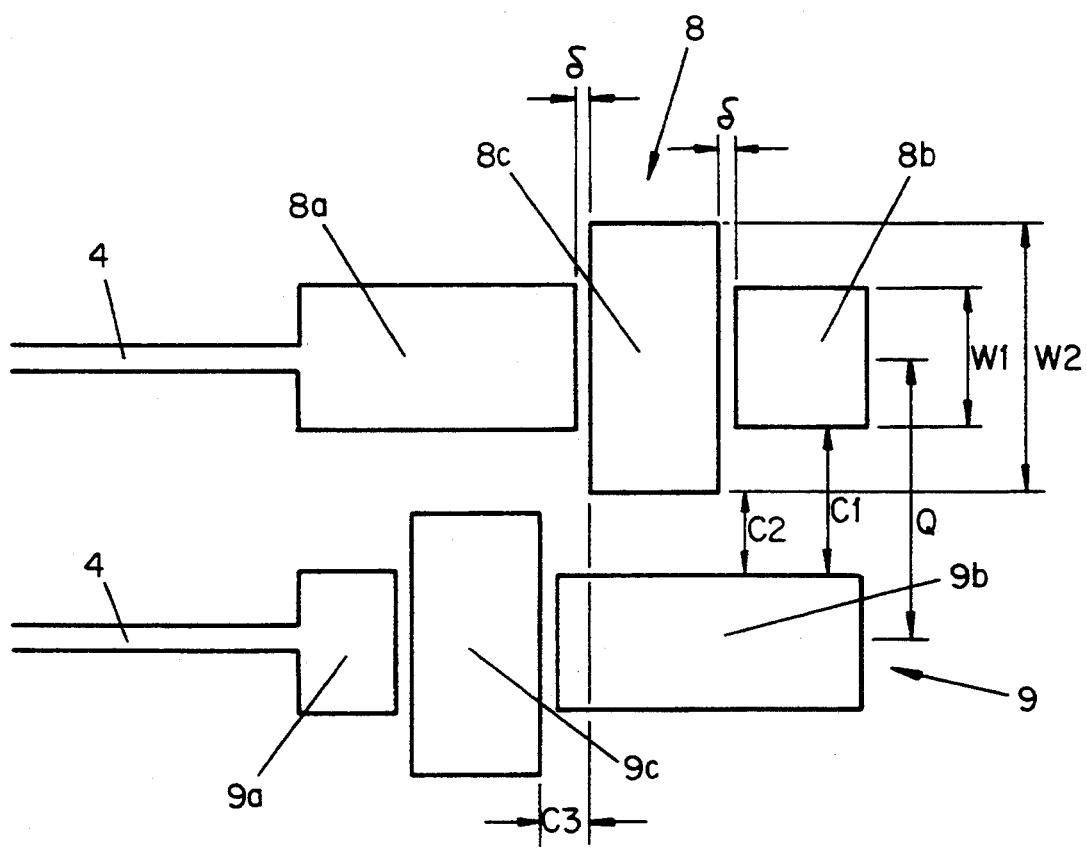

In FIG. 6, the configuration of each of lands 8, 9 also looks like a cross, but including isolated three rectangular portions. The land (8, 9) includes a narrow portion basically extending in the longitudinal direction thereof and having a predetermined constant width W1. That is, the land 8 consists of a first rectangular portion 8a connected with a pathway 4 and having a narrow width W1, a second rectangular portion 8c being spaced from the first rectangular portion 8a by a clearance δ and having a wide width W2, and a third rectangular portion 8b being spaced from the second rectangular portion 8c by a clearance 8 and having a narrow width W1. These first, second, and third rectangular portions 8a, 8c, and 8b are arrayed in a row and disposed symmetrically with respect to the longitudinal axis of the land 8.

Also, the land 9 consists of a first rectangular portion 9a connected with a pathway 4 and having a narrow width W1, a second rectangular portion 9c being spaced from the first rectangular portion 9a by a clearance δ and having a wide width W2, and a third rectangular portion 9b being spaced from the second rectangular portion 9c by a clearance δ and having a narrow width W1. These first, second, and third rectangular portions 9a, 9c, and 9b are arrayed in a row and disposed symmetrically with respect to the longitudinal axis of the land 9.

The lands 8 and 9 are disposed in parallel with each other so that their longitudinal axes become parallel. And, the portion 8c of the land 8 is offset from the wide portion 9c of the land 9 in the longitudinal direction, so as not to interfere with each other.

In more detail, the lands 8 and 9 are spaced one another so as to maintain a clearance Q between their longitudinal axes. A clearance between adjacent edges of the lands 8, 9 is C1 in the region where the narrow portions 8a, 8b confront with the confronting narrow portions 9a, 9b, respectively. This clearance reduces from C1 to C2 in the region where the wide portion 8c confronts with the narrow portion 9b or in the region where the wide portion 9c confronts with the narrow portion 8a. The offset amount between the wide portions 8c, 9c is set to maintain a clearance C3 in the longitudinal direction.

The purpose of offsetting the wide portions 8c, 9c is the same as the first and second embodiments. Also, the soldering operation of the leads of the electronic component P onto the lands 8, 9 is carried out in the same fashion as the first and second embodiments.

The clearance δ is a small clearance so that adjacent rectangular portions can contact with each other by coating solder cream and can be secured together by the solder after the thermal treatment.

As this invention may be embodied in several forms without departing from the spirit of essential characteristics thereof, the present embodiments are therefore illustrative and not restrictive, since the scope of the invention is defined by the appending claims rather than by the description preceding them, and all changes that fall within meets and bounds of the claims, or equivalence of such meets and bounds are therefore intended to embraced by the claims.

What is claimed is:

1. A printed circuit board comprising:
   a plurality of lands flatly formed on said circuit board, for soldering a plurality of leads of an electronic component thereon;
   pathways connected to said lands, each land being enlarged in width compared with a corresponding pathway;
   said lands being separately arranged parallel to one another;
   each of said lands including a first portion extending in a predetermined direction thereof and having a predetermined width, and a second portion extending from both side portions of said first portion in a direction transverse to a longitudinal direction of said first portion.

2. A printed circuit board according to claim 1, wherein said second portions of two adjacent lands are offset from each other in a longitudinal direction of said lands.

3. A printed circuit board according to claim 2, wherein said first and second portions are rectangular.

4. A printed circuit board according to claim 2, wherein said second portion has a semicircular configuration.

5. A printed circuit board according to claim 1, wherein said second portions have a width wider than that of said first portion.

6. A printed circuit board according to claim 5, wherein said first and second portions are rectangular.

7. A printed circuit board according to claim 5, wherein said second portion has a seimcircular configuration.

8. A printed circuit board according to claim 1, wherein said second portion has a semicircular configuration.

9. A printed circuit board according to claim 1, wherein said first and second portions are rectangular.

10. A printed circuit board comprising:
    a plurality of lands flatly formed on said printed circuit board, for soldering a plurality of leads of an electronic component thereon;
    pathways connected to said lands, each land being enlarged in width compared with a corresponding pathway;
    said lands being separately arranged in parallel to one another;
    each of said lands including:
    a first portion extending in a predetermined direction thereof and having a predetermined width, said first portion being divided into two parts in a longitudinal direction of said each of said lands, and
    a second portion being arranged between said two parts of said first portion, a width of said second portion being wider than that of said first portion in a perpendicular direction to the longitudinal direction of said each of said lands.

11. A printed circuit board according to claim 10, wherein said second portion is spaced apart from said first portion.

12. A printed circuit board comprising:
    a plurality of cruciform lands, each land being soldered to only one of a plurality of leads of an electronic component;
    said lands disposed along a surface of said printed circuit board and being separately arranged in parallel to one another;
    said each land including first and second portions soldered to one of said leads, said first portion extending in a predetermined direction of said each land and having two edges and a predetermined width therebetween, and said second portion extending substantially transversely to said predetermined direction from each of said two edges of said first portion.

13. A printed circuit board in accordance with claim 12, wherein said predetermined direction defines a first longitudinal axis of said first portion, said first portion being elongated in said predetermined direction of said first longitudinal axis, and wherein said second portion has a second longitudinal axis transverse to said first longitudinal axis, said second portion being elongated in a direction of said second longitudinal axis.

14. A printed circuit board in accordance with claim 13, wherein said first portion has a first width transverse to said first longitudinal axis defined by said predetermined width between said two edges thereof, and said second portion has a second width parallel to said first longitudinal axis of said first portion,
    said second width being equal to said first width.

15. A printed circuit board in accordance with claim 14, wherein each land is further connected to a respective pathway of said printed circuit board distinct from said first and second portions and extending along the surface of said printed circuit board, said pathway of said printed circuit board having a width smaller than said first width.

16. A printed circuit board in accordance with claim 15, wherein a lead portion of only one lead of the electronic component, soldered with said first and second portions of each land, is parallel to the surface of said printed circuit board.

17. A printed circuit board in accordance with claim 16, wherein said respective pathway of said printed circuit board is connected to said first portion of said each land.

18. A printed circuit board in accordance with claim 12, wherein each land is further connected to a respective pathway of said printed circuit board distinct from said first and second portions and extending along the surface of said printed circuit board, said pathway of said printed circuit board having a width smaller than said predetermined width between said two edges of said first portion.

19. A printed circuit board in accordance with claim 18, wherein said respective pathway of said printed circuit board is connected to said first portion of said each land.

20. A printed circuit board in accordance with claim 12, wherein a single lead portion of only one lead of the electronic component, soldered with both of said first and second portions of each land, is parallel to the surface of said printed circuit board.

21. A printed circuit board in accordance with claim 20, wherein each land is further connected to a pathway of said printed circuit board distinct from said first and second portions and extending along the surface of said printed circuit board, said pathway of said printed circuit board having a width smaller than said predetermined width between said two edges of said first portion.

22. A printed circuit board including a plurality of lands for soldering a plurality of leads of an electronic component thereon and pathways connected to said lands, each land being enlarged in width compared with a corresponding pathway, wherein said each land including a first portion having two parallel edges extending in a predetermined direction and having a first width therebetween, and a second portion extending from said edges of said first portion to have a second width wider than said first width of said first portion.

23. A printed circuit board in accordance with claim 22, wherein two second portions adjacent to each other are offset from each other in said predetermined direction.

24. A printed circuit board in accordance with claim 22, wherein said first and second portions are rectangular.

25. A printed circuit board in accordance with claim 22, wherein said second portion has a semicircular configuration.

26. A printed circuit board in accordance with claim 22, wherein said first portion is divided into two parts, and said second portion is arranged between said two parts of said first portion and spaced from said two parts of said first portion.

27. A printed circuit board comprising:
a plurality of lands flatly formed on said printed circuit board;
pathways connected to said lands, each land being enlarged in width compared with a corresponding pathway;
solder fully coated on said lands for forming solder bumps when melted, thereby connecting a plurality of leads of an electronic component to said lands via said solder bumps;
each of said lands including a first portion extending in a predetermined direction thereof, and a second portion extending from both side portions of said first portion in a direction transverse to a longitudinal direction of said first portion.

* * * * *